United States Patent [19]
Tomatsu et al.

[11] Patent Number: 5,998,268
[45] Date of Patent: Dec. 7, 1999

[54] MANUFACTURING METHOD OF SEMICONDUCTOR DEVICE WITH A GROOVE

[75] Inventors: Yutaka Tomatsu, Okazaki; Takeshi Miyajima, Kariya; Manabu Koike, Toyoake; Ryosuke Inoshita, Kasugai, all of Japan

[73] Assignee: Denso Corporation, Kariya, Japan

[21] Appl. No.: 08/938,472

[22] Filed: Sep. 29, 1997

[30] Foreign Application Priority Data

Sep. 30, 1996 [JP] Japan .................................. 8-258755

[51] Int. Cl.⁶ .................................................. H01L 21/336
[52] U.S. Cl. ........................... 438/271; 438/545; 438/702
[58] Field of Search ..................................... 438/133, 138, 438/237, 268, 270, 271, 272, 545, 548, 589, 702

[56] References Cited

U.S. PATENT DOCUMENTS

| | | | |
|---|---|---|---|
| 4,693,781 | 9/1987 | Leung et al. | 438/702 |
| 4,760,434 | 7/1988 | Tsuzuki et al. | 257/49 |
| 4,896,199 | 1/1990 | Tsuzuki et al. | 257/49 |
| 5,298,780 | 3/1994 | Harada | 438/270 |
| 5,460,985 | 10/1995 | Tokura et al. | 438/271 |
| 5,470,770 | 11/1995 | Takahashi et al. | 438/548 |

FOREIGN PATENT DOCUMENTS

| | | |
|---|---|---|
| 62-12167 | 1/1987 | Japan . |
| 7-273319 | 10/1995 | Japan . |
| 7-273323 | 10/1995 | Japan . |
| 7-273327 | 10/1995 | Japan . |
| 8-236766 | 9/1996 | Japan . |
| 8-293602 | 11/1996 | Japan . |

OTHER PUBLICATIONS

Wolf, "Silicon Processing for the VLSI Era", vol. 2 Process Integration, pp. 47–48, 1990.
Tokura et al., "The DMOS Consisting of Channel Region Defined by LOCOS (LOCOS–DMOS): A New Process/Device Technology for Low On–Resistance Power MOSFET", IEEE Proceedings of the 5th International Symposium On Power Semiconductor Devices And ICs, May 18–20, 1993, pp. 135–140.
Yokohama, Extended Abstracts of the 1994 International Conference on Solid State Devices and Materials, Aug. 23–26, 1994, pp. xxix–765.
Sakai et al. "Methods to Improve the Surface Planarity of Locally Oxidized Silicon Devices", Solid–State Science and Technology, vol. 124, No. 2, Feb. 1977, pp. 318–320.
"Solid State Devices and Materials", Japanese Journal of Applied Physics, Regular Papers, Short Notes & Review Papers, Part. 1, vol. 34, No. 2B, Feb. 1995, pp. viii–908.
"Developing Power MOSFET of 50MΩ.MM²" Nikkei Electronics, 1994, 9. 5, (No. 616) pp. 15–16.

*Primary Examiner*—Chandra Chaudhari
*Attorney, Agent, or Firm*—Pillsbury Madison & Sutro

[57] ABSTRACT

On the surface of a semiconductor substrate there are formed a silicon oxide film, silicon nitride film and resist, whereby a groove is formed in the semiconductor substrate through an opening portion by chemical dry etching. An oxide film is formed on the inner surface of the groove by wet oxidation and, further, this oxide film is removed by wet etching, after which the surface of the semiconductor substrate located on the outer-peripheral side of the groove from an angular portion defined between a side surface of the groove and the surface of the semiconductor substrate is exposed. Then, the inner surface of the groove and the exposed surface of the semiconductor substrate are oxidized to thereby form a LOCOS oxide film, and thereafter this LOCOS oxide film is removed. As a result of this, the angular portion is made round, thereby enabling the avoidance of the concentration of an electric field on the angular portion of the groove.

25 Claims, 18 Drawing Sheets

MANUFACTURING METHOD OF SEMICONDUCTOR DEVICE WITH A GROOVE

CROSS REFERENCE TO RELATED APPLICATION

This application is based upon and claims the benefit of priority of the prior Japanese Patent Application No. H.8-258755 filed on Sep. 30, 1996, the contents of which are incorporated herein by reference.

BACKGROUND OF THE INVENTION

1. Field of the Invention

The present invention relates to a manufacturing method for manufacturing a semiconductor device and, more particularly, a manufacturing method for manufacturing a semiconductor device, which is suitably applied to an IGBT, DMOSFET or the like.

2. Description of the Related Art

Among MOS type semiconductor devices such as an IGBT or DMOSFET, there is one which has a groove in the surface of its semiconductor substrate. In this type of semiconductor device, a gate electrode is disposed on the groove through a gate insulation film and a channel region is formed in the semiconductor substrate along the side surface of the groove. As a manufacturing method for manufacturing the semiconductor device having this groove structure, see U.S. Pat. No. 5,470,770, a mask which has been patterned to a predetermined shape is disposed on a silicon substrate, and, through the openings of the mask, chemical dry etching is performed to thereby form a groove. Then, within this groove, a LOCOS (Local Oxidation of Silicon) oxide film is formed. Further, by removing the LOCOS oxide film, the groove is completed and then a gate electrode is disposed in the groove through a gate oxide film.

It is to be noted that the word "groove" which is used in this specification represents not only an elongate groove but also a short groove (e.g., one which is square shaped when viewed from above).

However, in this manufacturing method, after the chemical dry etching is performed, an angular portion which is defined between the side surface of the groove and the upper surface of the substrate inconveniently sharpens, raising the problem that the electric field is concentrated on this angular portion. As a result, the service life of the gate becomes varied or short. That is, the end of the LOCOS oxide film which corresponds to this angular portion becomes a "bird's beak", and so the degree in which the angular portion sharpens does not almost become low even after the formation of the gate oxide film. For this reason, the concentration of the electric field occurs.

SUMMARY OF THE INVENTION

Accordingly, an object of the present invention is to provide a method for manufacturing a semiconductor device which makes it possible to avoid an electric field from being concentrated on an angular portion of a groove.

According to the manufacturing method for manufacturing a semiconductor device of the present invention, through the execution of a first step, a mask which has an opening at a predetermined region is formed on the surface of a semiconductor substrate and then, through the execution of a second step, a groove is formed in the semiconductor substrate by way of the opening of the mask. And, through the execution of a third step, the surface of the semiconductor substrate which is located on the outer-peripheral side from an angular portion defined between the side surface of the groove and this surface of the semiconductor substrate (a bent portion located on the periphery of the groove) is exposed and then, through the execution of a fourth step, the inside surface of the groove and the exposed surface of the semiconductor substrate are oxidized whereby an oxide film is formed. At this time, by the formation of this oxide film, the angular portion between the side surface of the groove and the surface of the semiconductor substrate is rounded. Further, through the execution of a fifth step, the oxide film is removed. Using the groove which has been formed as mentioned above, it is possible to obtain a semiconductor device in which a gate electrode has been extended through a gate insulation film in such a way as to oppose the angular portion between the side surface of the groove and the surface of the semiconductor substrate.

Since the angular portion between the side surface of the groove and the surface of the semiconductor substrate is rounded in this way, in a case where the gate electrode is provided over a region from the side surface of the groove to the surface of the semiconductor substrate, the occurrence of the phenomenon that the electric field is concentrated on the angular portion of the groove to decrease the service life of the gate can be suppressed in the MOS type semiconductor device having such a structure.

In the above-mentioned second step, it is preferable to perform chemical dry etching with a resist being left on a silicon nitride film as a mask to thereby form the groove. If the resist is left on the silicon nitride film, when etching is performed, the silicon nitride film is protected by means of the resist and so the thinning thereof which results from this etching can be suppressed compared to a case where there is no resist left thereon. Accordingly, in a case where the resist is removed before performing the etching, it is necessary to make the thickness of the silicon nitride film greater in advance. However, if it is arranged that the resist be left as mentioned above, it is possible to thin the silicon nitride film. Here, in a case where a silicon nitride film is formed on the semiconductor substrate, the surface thereof receives a stress from the silicon nitride film. The thicker the nitride film, the larger the stress becomes. Accordingly, in order to make small the stress received by the semiconductor substrate from the nitride film, it is necessary to thin the nitride film. Especially, in the present invention, since the channel region and source region are formed in the semiconductor substrate at the side surface of the groove, the action of a large stress on these regions is not preferable because there is the likelihood of the characteristic of the semiconductor element being varied as a result of such action. Therefore, the thinning of the nitride film in the present invention is particularly effective.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS (First Embodiment)

A first embodiment of the present invention will now be explained with reference to the drawings.

Figure 1:
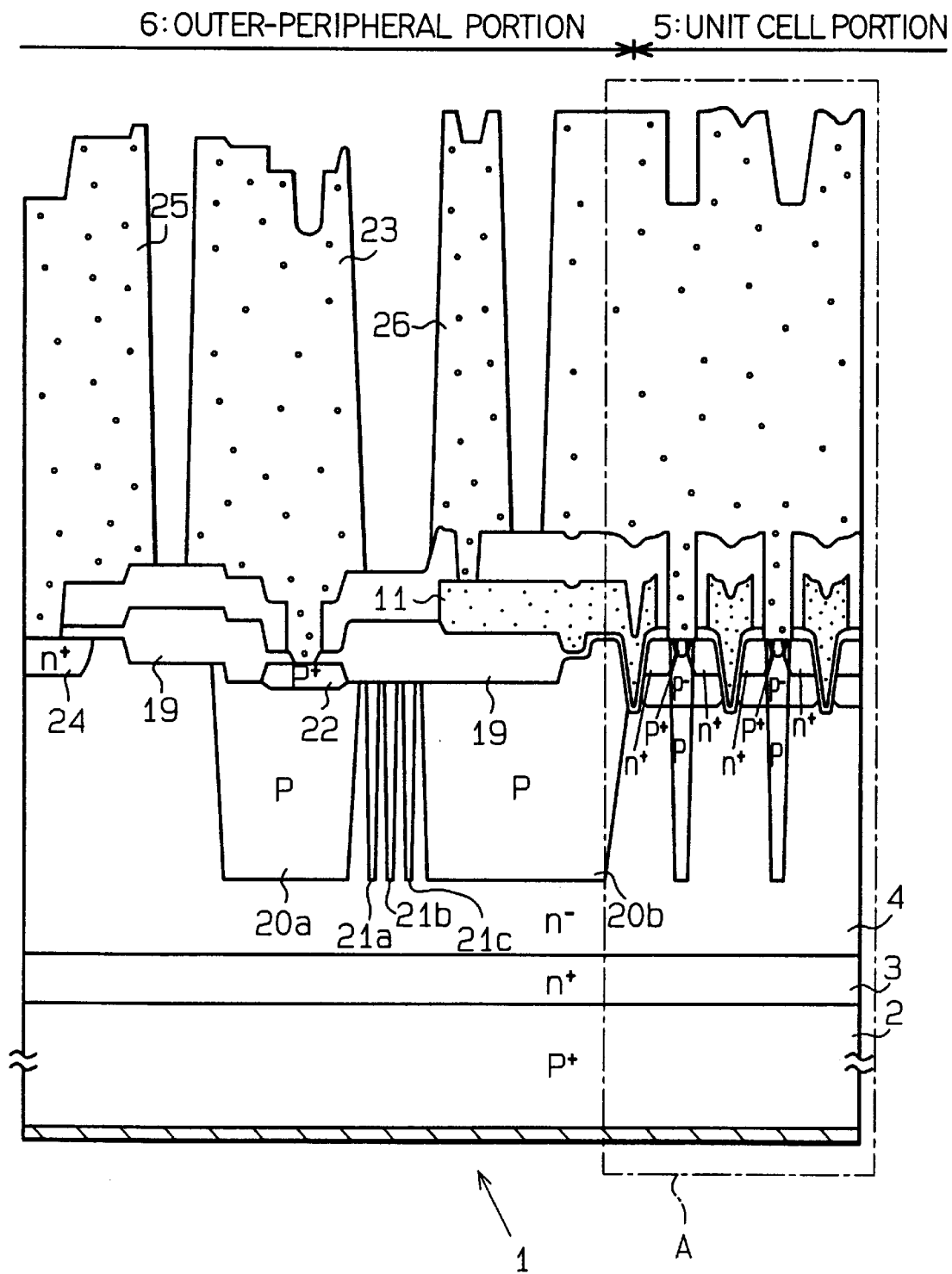
FIG. 1 is a sectional view illustrating a semiconductor device according to a first embodiment of the present invention.

FIG. 1 is a sectional view illustrating a semiconductor device according to this embodiment. In this embodiment, the invention is embodied as an n-channel type IGBT having a groove structure.

In a semiconductor substrate 1, on a $p^+$ type silicon substrate 2 there is formed an $n^+$ type epitaxial layer 3 and, on the $n^+$ type epitaxial layer 3 there is formed an $n^-$ type epitaxial layer 4. In this way, in the semiconductor substrate 1, on the surface side thereof there is formed the $n^-$ type epitaxial layer 4.

Figure 2:
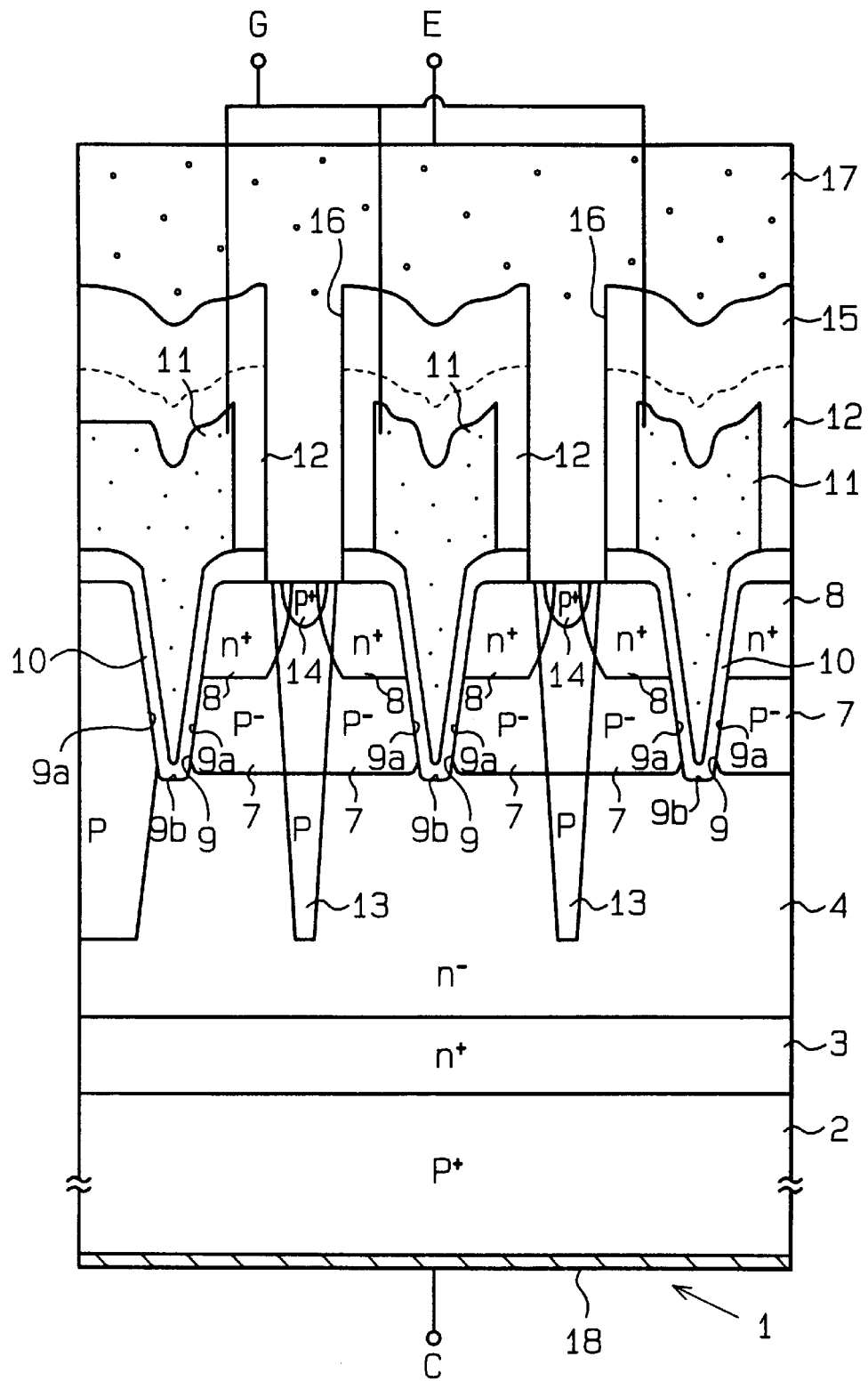
FIG. 2 is an enlarged view illustrating a portion A of FIG. 1.

In FIG. 1, the central part of the element formed on the semiconductor substrate 1 constitutes a unit cell portion 5 and, a surrounding portion thereof constitutes an outer-peripheral portion 6. FIG. 2 is an enlarged view of the unit cell portion 5 (an enlarged view of a portion A of FIG. 1). The unit cell portion 5 will be explained using this FIG. 2.

In a surface layer portion of the n type epitaxial layer 4, there are formed $p^-$ type channel regions 7 each of large depth and $n^+$ type source regions 8 each of small depth. In an upper surface (obverse surface) of the semiconductor substrate 1, there are formed grooves 9. A side surface 9a of this groove 9 is formed slantwise (tapered). Also, a bottom surface 9b of the groove 9 is located in a disposition region of the $n^-$ type epitaxial layer 4 and the channel region 7 and source region 8 are formed along the side surface 9a of the groove 9. In this way, the source region 8 is formed at the side surface 9a of the groove and the channel region 7 is formed under the source region 8.

An angular portion defined between the bottom surface 9b and side surface 9a of the groove 9 is made round. Further, an angular portion defined between the side surface 9a of the groove 9 and the surface of the substrate 1 is also made round. This groove configuration is one which is obtained by the groove 9 being formed using a LOCOS oxide film 32 of FIG. 22 in the manufacturing step as described later. This groove 9 is called "a concave groove" and so the IGBT of this embodiment is designed to be a concave type IGBT.

On the inner wall surface of the groove 9 as well as the surface of the source region 8 in the peripheral portion of the groove 9, there is formed a thin silicon oxide film 10 serving as the gate insulation film. On the silicon oxide film which is in the interior of the groove 9 and in the peripheral portion thereof, there is disposed a polysilicon gate electrode 11, the surface of which is covered with a silicon oxide film 12. In this way, the polysilicon gate electrode 11 is extended through the silicon oxide film 10 serving as the gate insulation film in such a way as to oppose the angular portion defined between the side surface 9a of the groove 9 and the surface of the semiconductor substrate 1.

In the $n^-$ type epitaxial layer 4, there are formed p type well regions 13 and $p^+$ type regions 14 with which contact to an electrode 17 is made. Further, on the polysilicon gate electrode 11 there is disposed an interlayer insulation film 15 such as a BPSG. On the interlayer insulation film 15 there is disposed an emitter electrode (cathode electrode, source electrode) 17 made of aluminum or the like, which emitter electrode 17 makes contact with at least the source regions 8 and the $p^+$ type regions 14 through opening portions 16.

Also, on a reverse surface of the semiconductor substrate 1, there is disposed a collector electrode (anode electrode, drain electrode) 18.

In FIG. 1, in the outer-peripheral portion 6, a LOCOS oxide film 19 is formed on the surface of the semiconductor substrate 1 and further the polysilicon gate electrode 11 is formed on this LOCOS oxide film 19 in such a way as to extend thereover. The polysilicon gate electrode 11 is connected to a wiring 26 made of aluminum or the like.

Also, in the $n^-$ type epitaxial layer 4 of FIG. 1, there are formed p type regions 20a, 20b, 21a, 21b and 21c. In the p type region 20a, there is formed a $p^+$ type region 22 with which an electrode 23 made of aluminum or the like is contacted. Also, in the $n^-$ type epitaxial layer 4, there is formed an $n^+$ type region 24 with which an electrode 25 made of aluminum or the like is contacted.

Next, the manufacturing steps will be explained.

Figure 3:
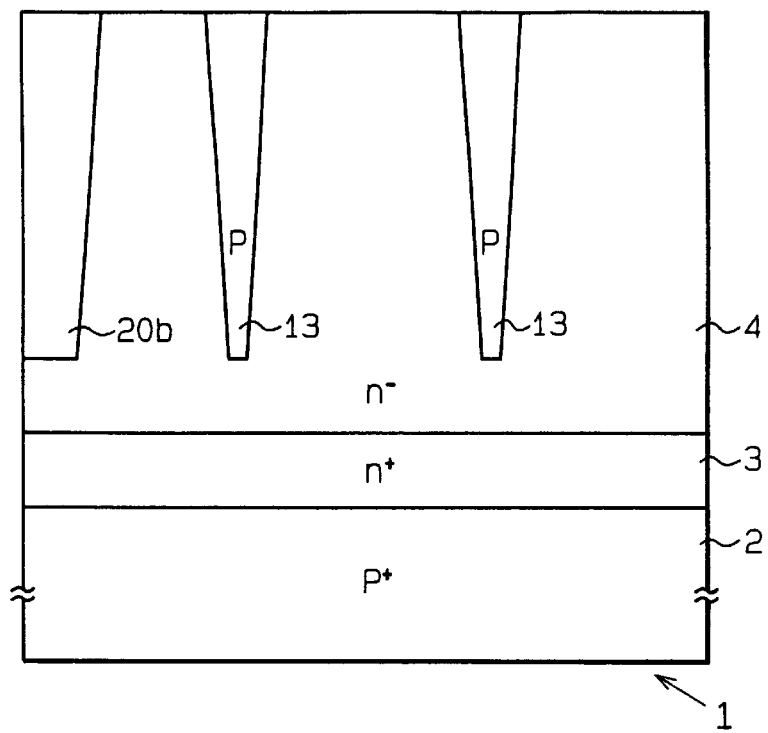
FIGS. 3 to 12 are sectional views illustrating manufacturing steps each for manufacturing the semiconductor device according to the first embodiment of the present invention.

First, as illustrated in FIG. 3, a semiconductor substrate 1 having the epitaxially grown layers is prepared. That is, the $n^+$ type epitaxial grown layer 3 is formed on the $p^+$ type silicon substrate 2 and then the $n^-$ type epitaxial layer 4 is formed on the $n^+$ type epitaxial layer 3. And, the p type well region 13 is formed with respect to the semiconductor substrate 1 and, in the outer-peripheral portion thereof, there are formed the p type regions 20a, 20b, 21a, 21b and 21c.

Figure 4:
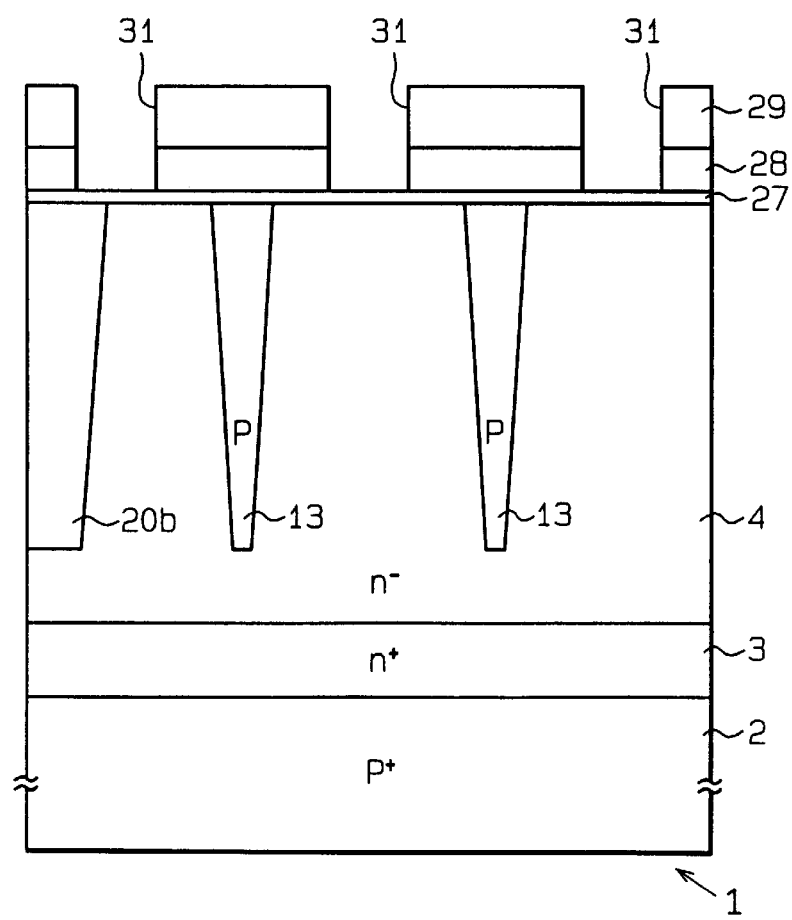

Further, as illustrated in FIG. 4, a pad oxide film (silicon oxide film) 27 is formed on the $n^-$ type epitaxial layer 4. The thickness of the pad oxide film 27 is from 300 to 2000 Å. Further, on this pad oxide film 27, there is formed a silicon nitride film 28 having a thickness of from 1000 to 5000 Å and, on this silicon nitride film 28, there is disposed a resist 29 that has been patterned. And, using the resist 29 as a mask, the silicon nitride film 28 which corresponds to regions where grooves are to be formed is removed by dry etching. Thereafter, the pad oxide film 27 which corresponds to each of opening portions 31 is removed by dry etching (or wet etching, or wet etching and dry etching).

It is to be noted that the silicon nitride film 28 and the pad oxide film 27 may be removed by one-time continuous dry etching.

Figure 5:
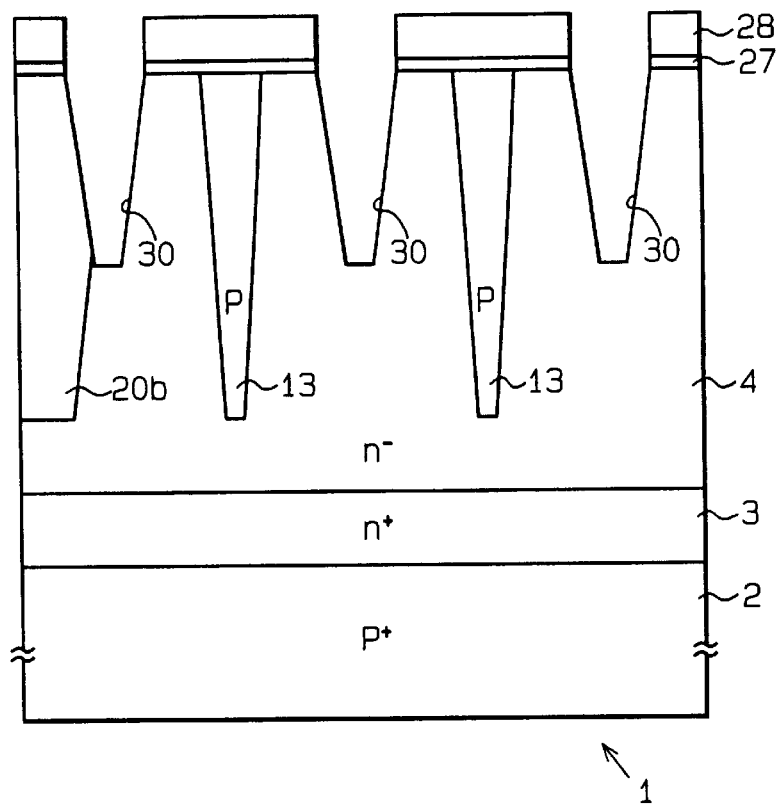

Subsequently, as illustrated in FIG. 5, the grooves 30 each having a depth of approximately 0.1 μm are formed in the surface of the semiconductor substrate 1. The steps for the formation of this groove 30 will now be described in more detail with reference to FIGS. 13 to 18. It is to be noted that in FIGS. 13 through 18 the illustration of the p+ type silicon substrate 2, n+ type epitaxial layer 3, etc. is omitted.

Figure 13:
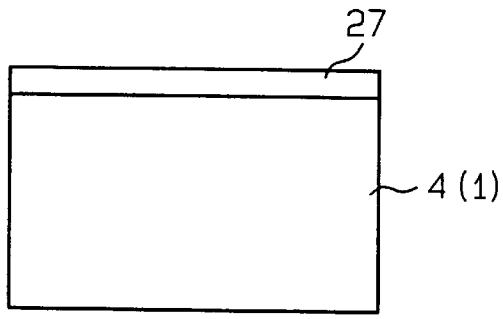
FIGS. 13 to 18 are sectional views illustrating forming steps each for forming a groove of the semiconductor device.
Figure 16:
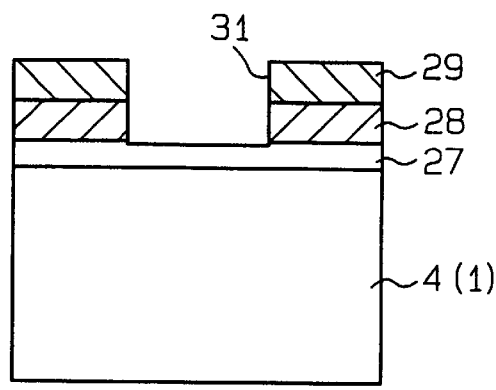
Figure 14:
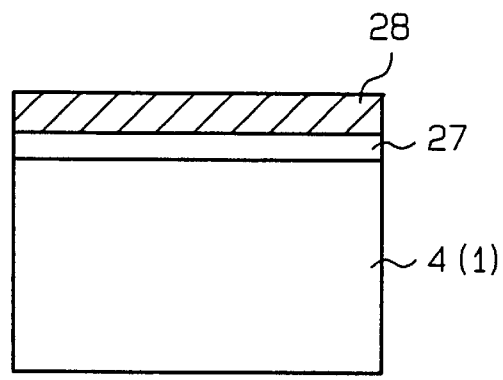
Figure 17:
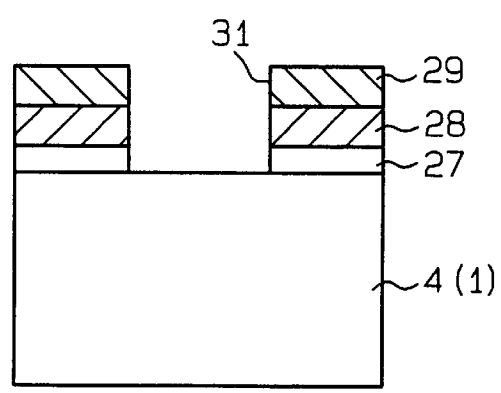
Figure 15:
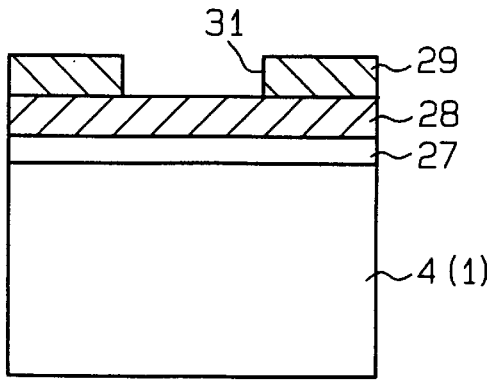
Figure 18:
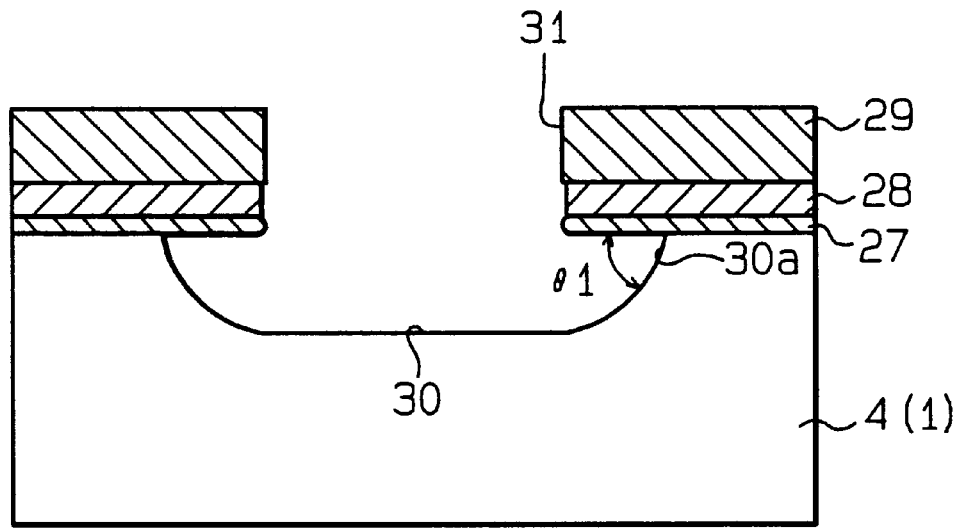

As illustrated in FIGS. 13, 14 and 15, on the silicon substrate 1, there are sequentially formed the pad oxide film 27 having a thickness of 425 Å, the silicon nitride film 28 having a thickness of 1500 Å and the resist 29 having the opening portion 31 at a predetermined region in this order. Further, as illustrated in FIGS. 16 and 17, the silicon nitride film 28 and the pad oxide film 27 are removed by way of the opening portion 31 of the resist 29. Then, as illustrated in FIG. 18, using the resist 29 and silicon nitride film 28 as a mask, the groove 30 is formed in the silicon substrate 1 by chemical dry etching (isotropic etching). The depth of the groove 30 is from 0.3 to 3.0 μm. As a result, an angular portion is formed by the side surface 30a of the groove 30 and the surface of the semiconductor substrate 1.

Figure 25:
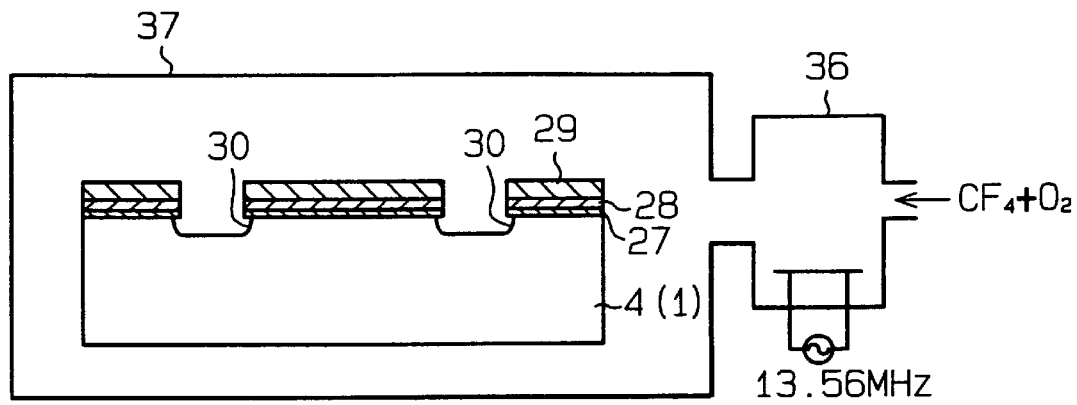
FIG. 25 is a typical view illustrating a chemical dry etching step.

The steps for forming the groove 30 by chemical dry etching will now be described in more detail. As illustrated in FIG. 25, plasma is generated in a discharging chamber 36 to which carbon tetrafluoride and oxygen gas have been supplied, to thereby produce chemical active species. The active species are transported into a reaction chamber 37 in which chemical dry etching is isotropically performed of the silicon substrate 1 (epitaxial layer 4) to thereby form the groove 30.

Since in this groove forming step chemical dry etching is performed with the resist 29 being left on the silicon nitride film 28 as it is to thereby form the groove 30, the thickness of the silicon nitride film 28 can be made as small as approximately 1500 Å which is ordinarily employed. That is, when forming the groove 30 by performing chemical dry etching after removing the resist 29, the silicon nitride film 28 also is etched approximately 1500 Å during the chemical dry etching and therefore it is necessary that the thickness of the silicon nitride film 28 be not less than 2500 Å. However, by performing chemical dry etching with the resist 29 being left as it is, it is possible to make the thickness of the silicon nitride film 28 as small as 1500 Å or so. As a result of this, it is possible to make small the stress received by the silicon substrate 1 from the silicon nitride film 28. In this way, the groove 30 of FIG. 5 is formed.

Figure 6:
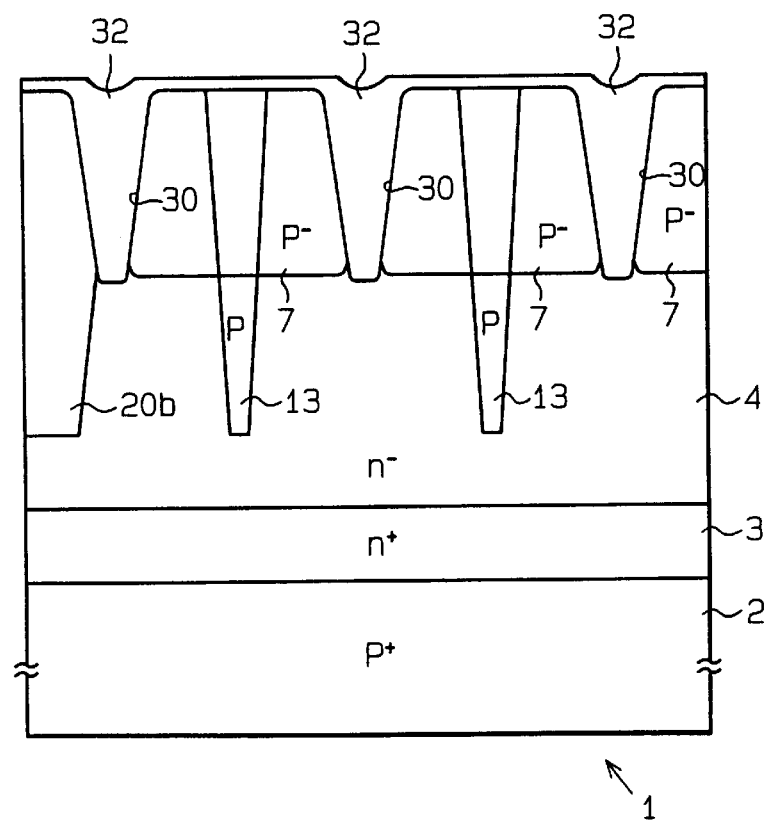

Next, as illustrated in FIG. 6, a LOCOS oxide film 32 is formed in the groove 30. The steps for the formation of this LOCOS oxide film 32 will be explained in more detail with reference to FIGS. 19 through 22. In FIGS. 19 through 22 the illustration of the p+ type silicon substrate 2, n+ type epitaxial layer 3, etc. is omitted.

Figure 19:
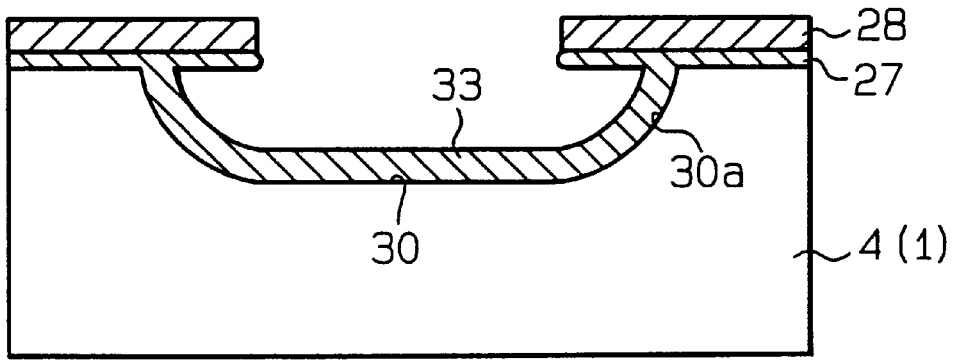
FIGS. 19 to 22 are sectional views illustrating forming steps each for forming a LOCOS oxide film.

As illustrated in FIG. 19, wet oxidation is performed to thereby form on the inner surface of the groove 30 an oxide film 33 having a thickness of from 400 to 2000 Å (more specifically, 850 Å). At this time, the damages which have been caused to the inner surface of the groove 30 by dry etching are recovered and at the same time there is the effect that the angular portion defined by the side surface 30a of the groove 30 and the surface of the semiconductor substrate 1 is chamfered (that the angular portion is rounded).

Figure 20:
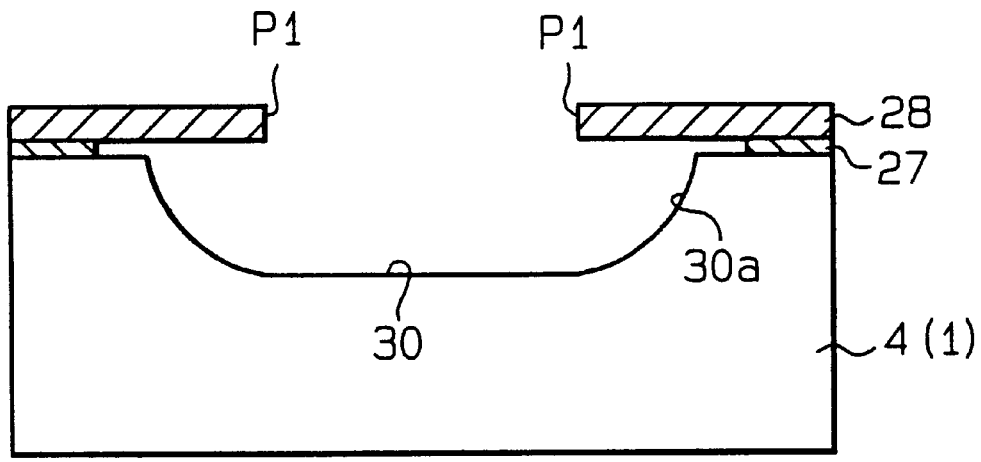

Further, as illustrated in FIG. 20, using the silicon nitride film 28 as a mask, wet etching is performed of the oxide film 33 with hydrofluoric acid (BHF) or a solution of hydrofluoric acid (HF). As a result of this, the oxide film 33 formed on the inner surface of the groove 30 is removed and the pad oxide film 27 located under the silicon nitride film 28 is also retreated approximately 0.1 to 5.0 μm from an end surface P1 of this silicon nitride film 28.

Figure 21:
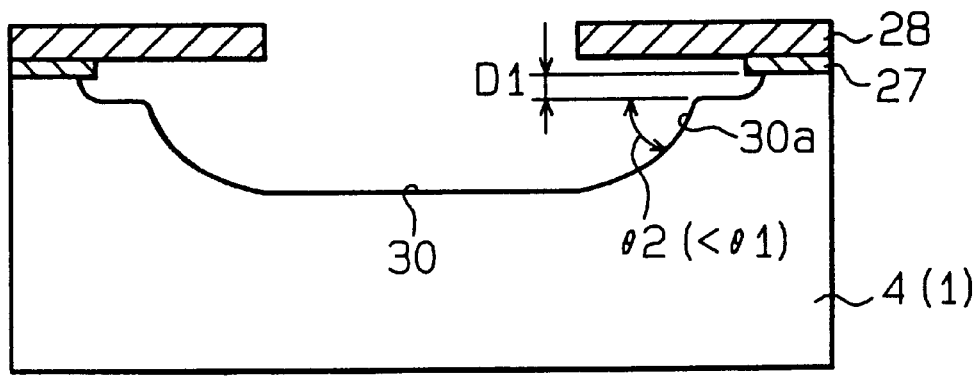

Subsequently, as illustrated in FIG. 21, using the silicon nitride film 28 as a mask, chemical dry etching for chamfering to a depth of approximately 0.05 to 0.5 μm is performed.

It is to be noted that the step for performing wet oxidation illustrated in FIG. 19 can be omitted.

Figure 22:
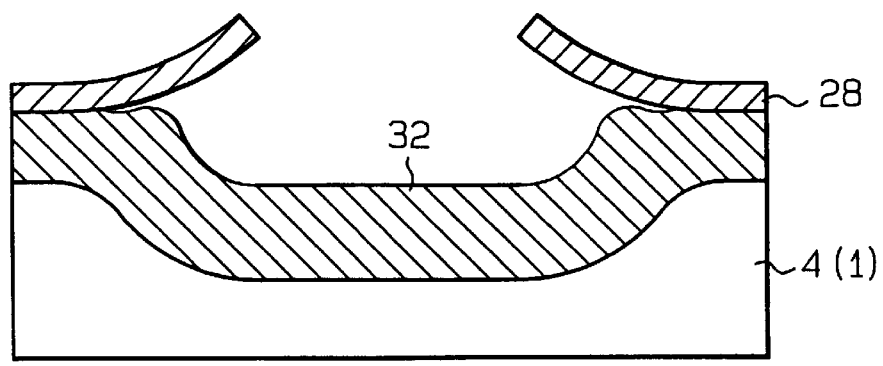

Further, as illustrated in FIG. 22, using the silicon nitride film 28 as a mask, the oxide film 32 is formed with respect to the groove formation portion of the IGBT element by LOCOS oxidation (cell LOCOS oxidation). At this time, the thickness of the LOCOS oxide film 32 is from 3000 to 15000 Å, more specifically 9500 Å. In this way, the LOCOS oxide film 32 of FIG. 6 is formed. At this time, owing to the effects of the above-mentioned chamfering process illustrated in FIG. 21 and the above-mentioned LOCOS oxidation process illustrated in FIG. 22, the angular portion (bent portion) is rounded.

Figure 7:
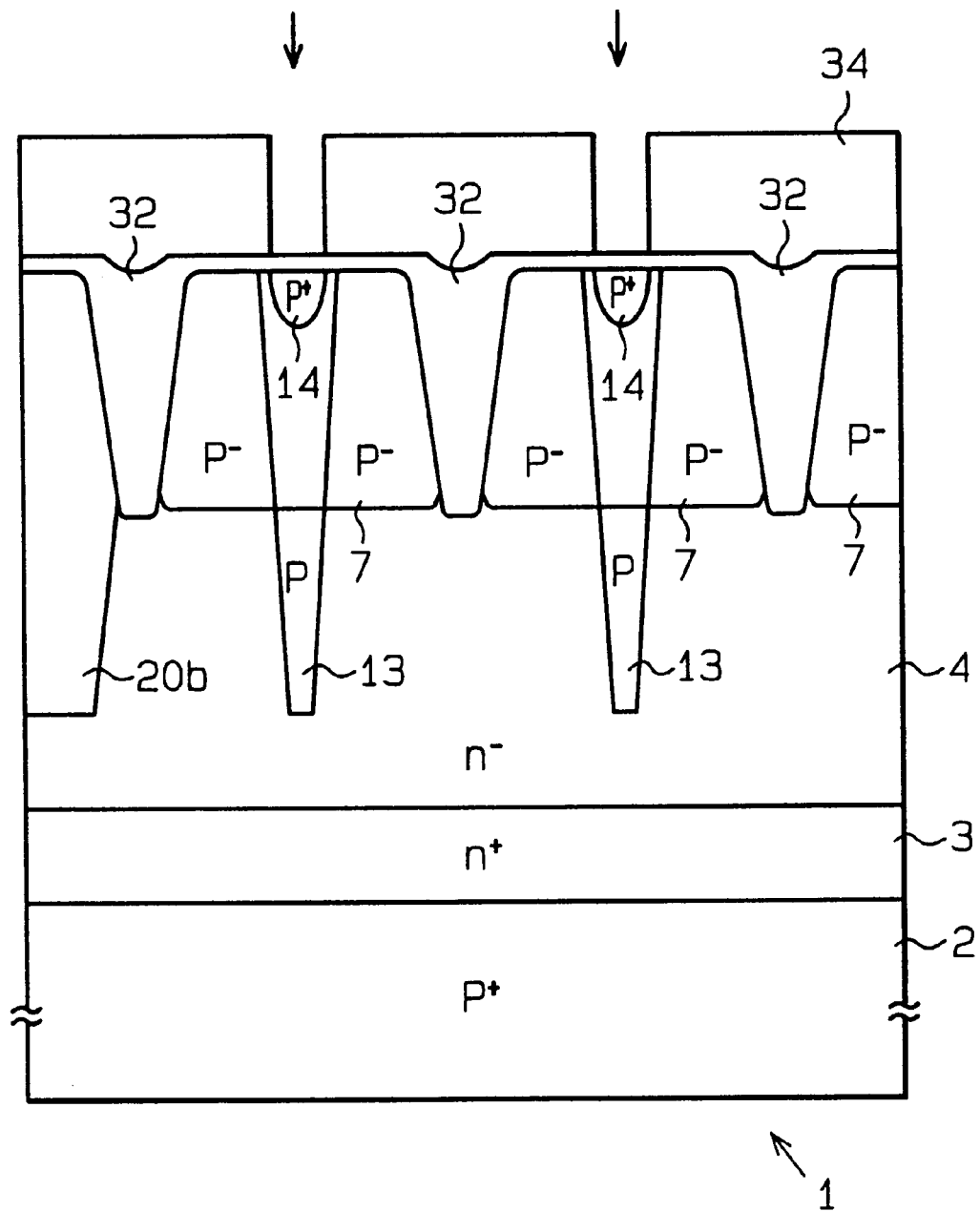

Next, in order to form the p type channel region 7 of FIG. 6, boron (B) ions in a dose of approximately $3.0 \times 10^{13}$ to $1.1 \times 10^{14}$ are implanted at approximately 50 keV and thermal diffusion is performed in an atmosphere of $N_2$ at approximately 1050° C. for a time period of approximately 40 to 100 minutes. Thereafter, as illustrated in FIG. 7, in order to form the p+ type region 14 for making contact with the emitter electrode, using a resist 34, boron (B) ions in a dose of approximately $3.0 \times 10^{14}$ to $1.5 \times 10^{15}$ are implanted at approximately 40 keV and then thermal diffusion is further performed in an atmosphere of $N_2$ at approximately 1050° C. for a time period of approximately 30 to 90 minutes.

Figure 8:
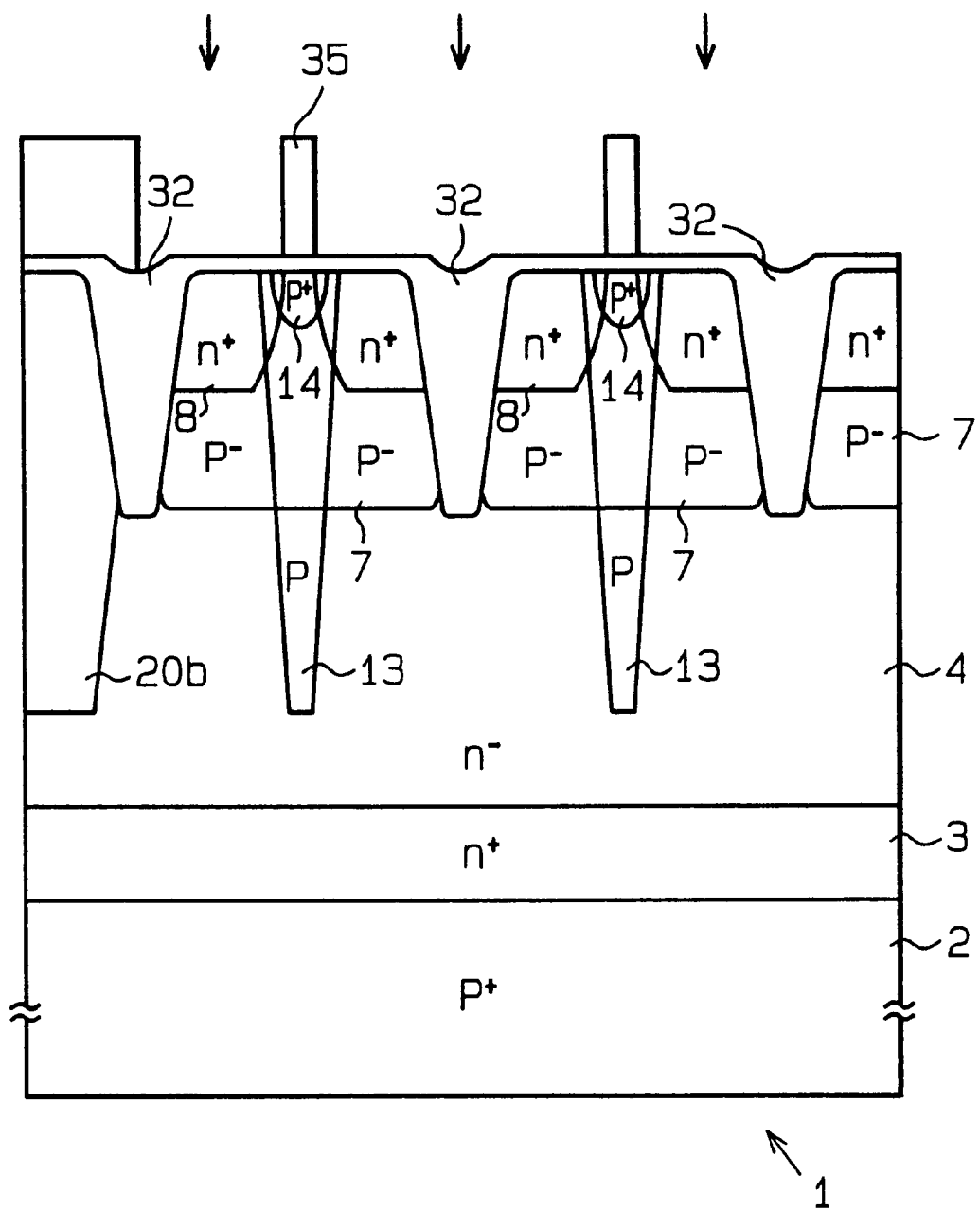

And, as illustrated in FIG. 8, in order to form the n+ type source region 8, using a resist 35, arsenic (As) or phosphorus (P) ions in a dose of approximately $7.0 \times 10^{14}$ to $5.0 \times 10^{15}$ are implanted at approximately 80 keV and then thermal diffusion is further performed in an atmosphere of $N_2$ at approximately 1000° C. for a time period of approximately 200 to 400 minutes.

Figure 9:
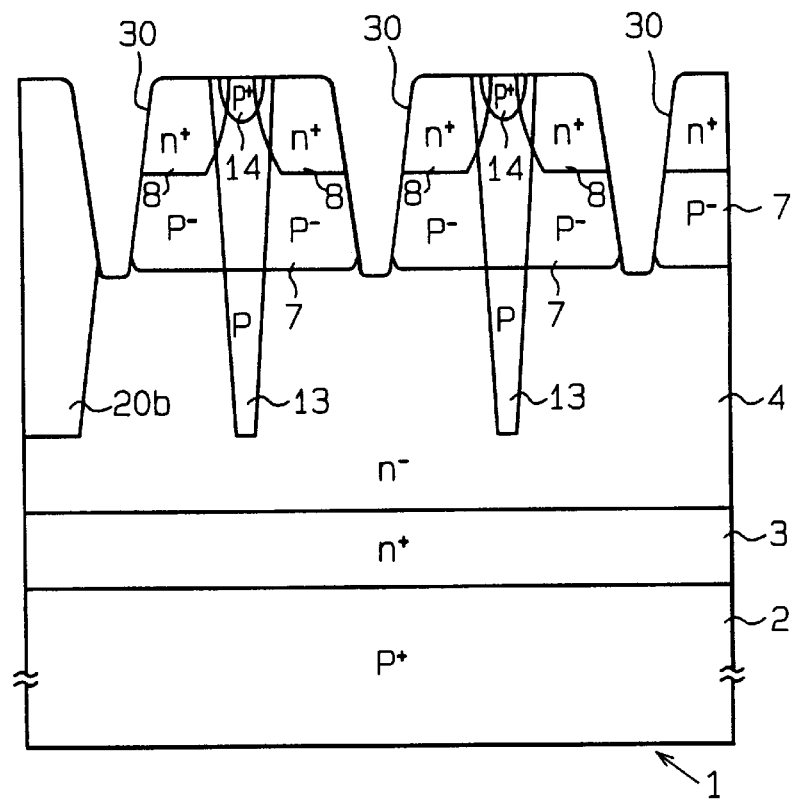
Figure 10:
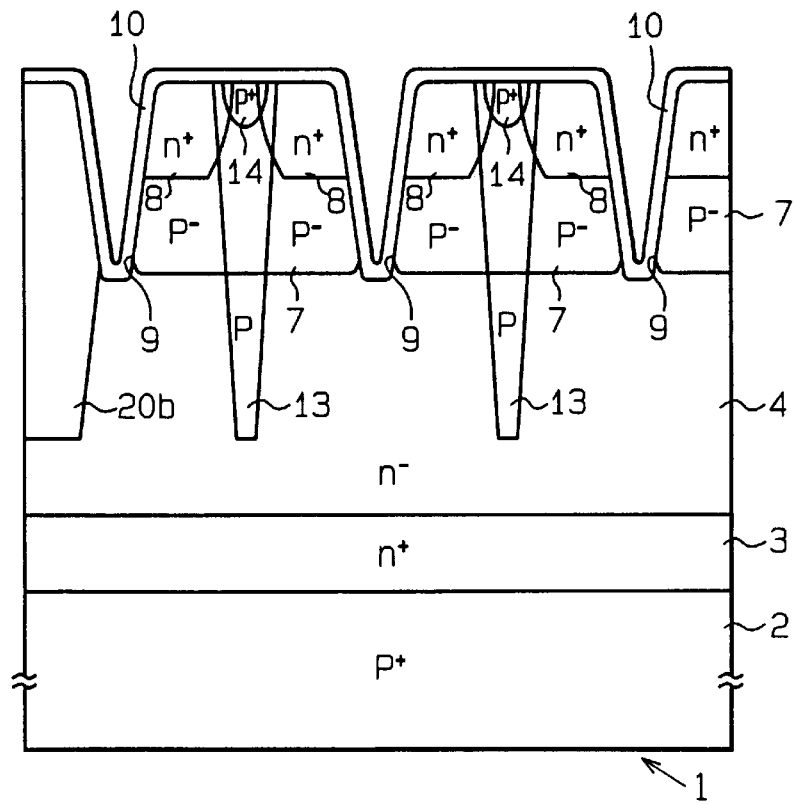
Figure 23:
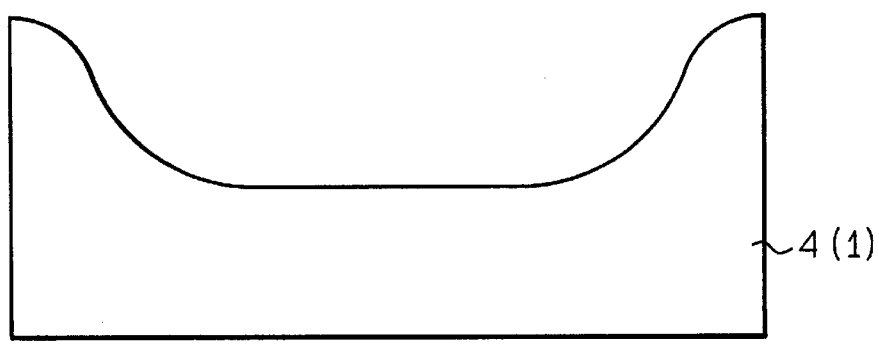
FIG. 23 is a sectional view illustrating a removing step for removing the LOCOS oxide film.
Figure 24:
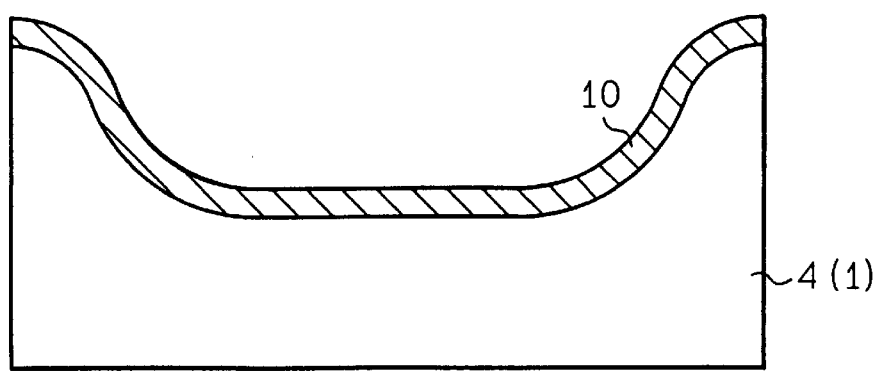
FIG. 24 is a sectional view illustrating a forming step for forming a gate oxide film.

Next, as illustrated in FIGS. 9 and 23, the cell LOCOS oxide film 32 of the groove formation portion is removed by wet etching. And, as illustrated in FIGS. 10 and 24, the gate oxide film 10 having a thickness of from 400 to 1600 Å is formed.

Figure 11:
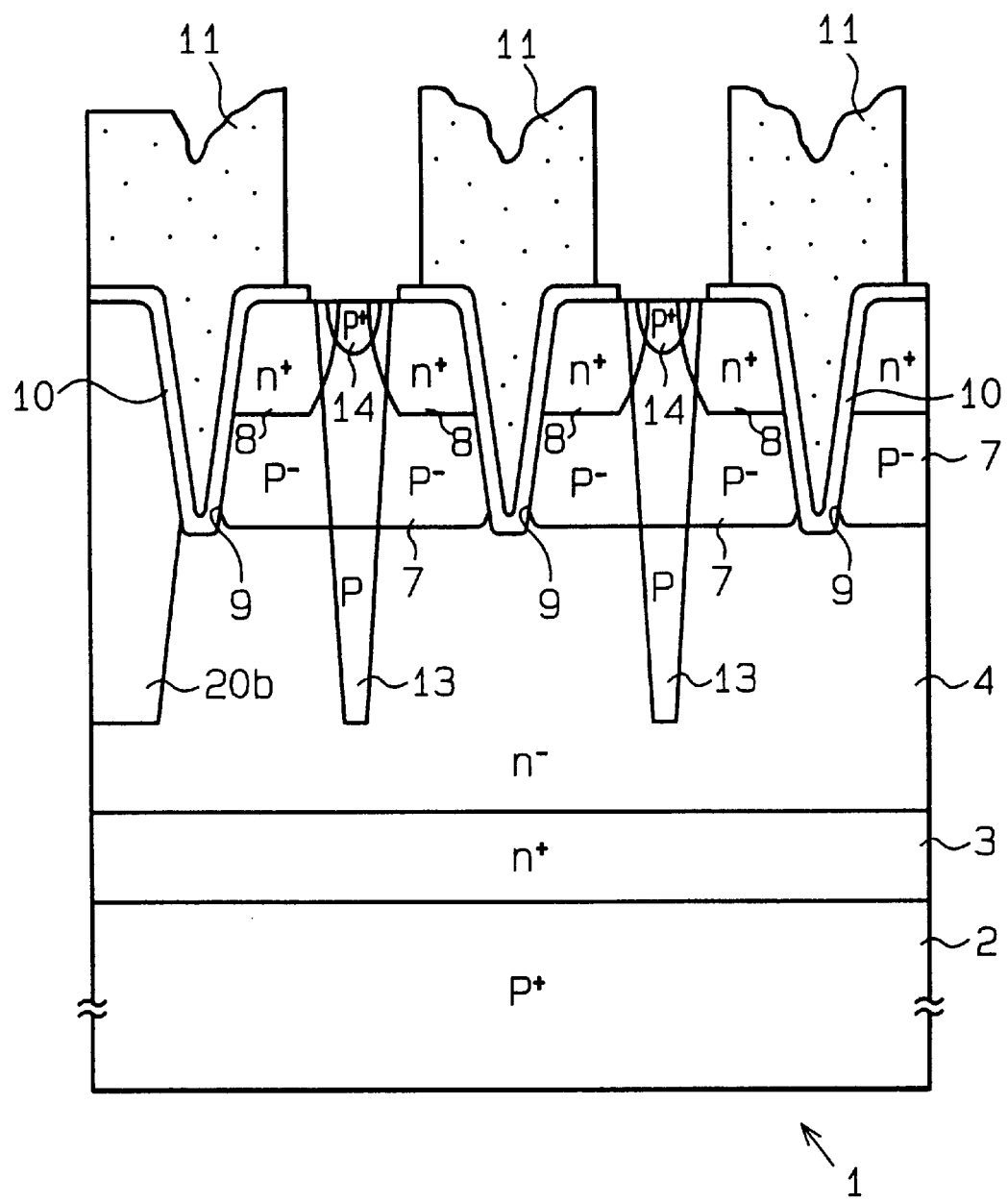
Figure 26:
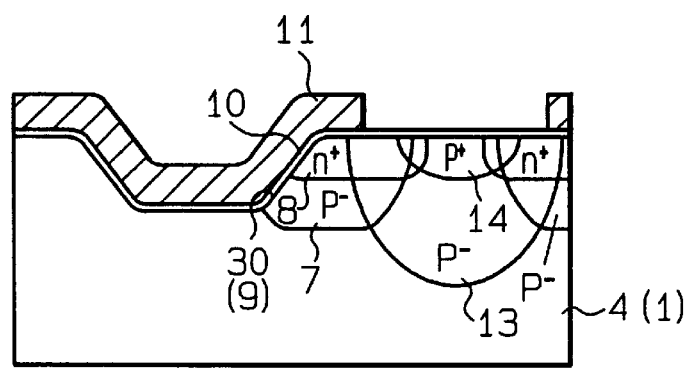
FIGS. 26 and 27 are sectional views illustrating the manufacturing steps each for manufacturing the semiconductor device.
Figure 27:
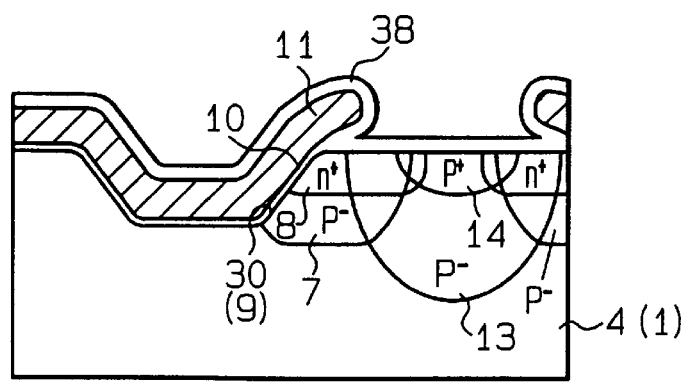

Further, as illustrated in FIG. 11, the polysilicon gate electrode 11 having a thickness of, for example, 4400 Å is disposed at predetermined regions. And, as illustrated in FIGS. 26 and 27, the surface of the polysilicon gate electrode 11 is oxidized by wet oxidation, thereby making the end surface of this electrode 11 round through the formation of the oxide film 38. It is to be noted that FIG. 26 illustrates a state which is observed before the wet oxidation is performed and FIG. 27 illustrates a state which is observed after the wet oxidation is performed. The thickness of the oxide film on the polysilicon at this time is suitably from 600 to 3000 Å.

Here, since the angular portion (bent portion) defined between the side surface of the groove 30 (9) and the upper surface of the semiconductor substrate 1 is rounded as mentioned above, it is possible to suppress the concentration of the electric field on this angular portion (bent portion) and therefore to increase the service life of the gate.

It is to be noted that in FIGS. 23 through 27 with reference to which the above explanation has been made, also, the illustration of the p+ type silicon substrate 2, n+ type epitaxial layer 3, etc. is omitted.

Figure 28A:
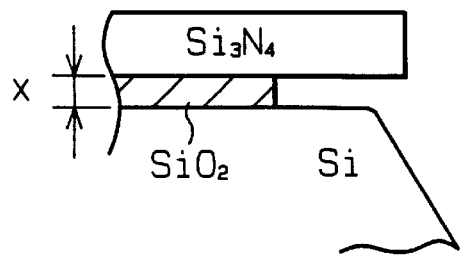
FIGS. 28A to 28E are views illustrating the relationships among the thickness x of the oxide film, the etching depth y of silicon, the LOCOS oxidation depth z of silicon and the wet oxidation depth a of silicon.
Figure 28B:
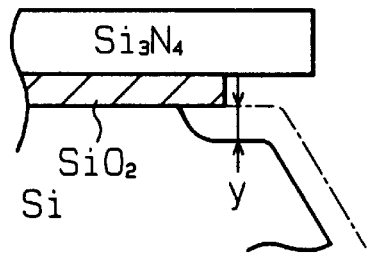
Figure 28C:
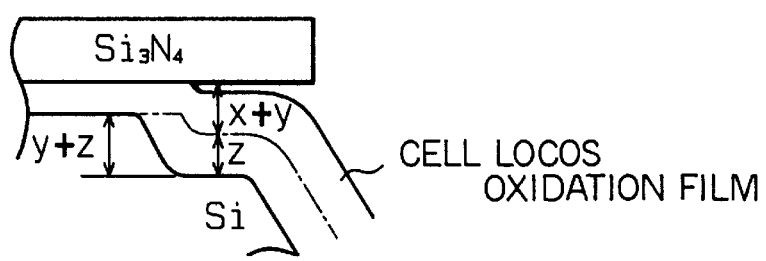
Figure 28D:
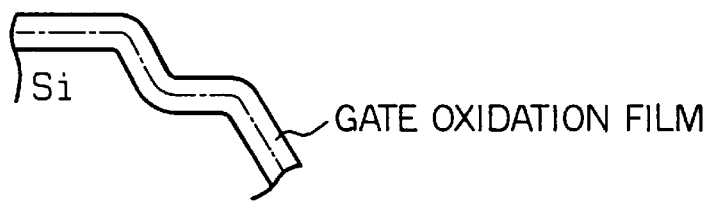
Figure 28E:
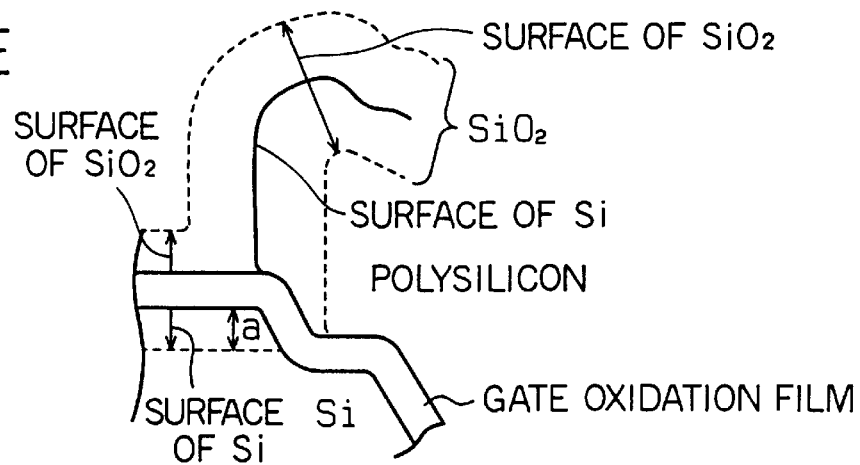

Here, description will be given to the relationships among film thickness x and silicon depths y, z and a which are illustrated in FIGS. 28A to 28E. That is, assuming that the thickness of the pad silicon oxide film 27 illustrated in FIG. 28A is represented by x, the etching depth of the silicon after the performance of the second-time chemical dry etching, illustrated in FIG. 28B, is represented by y, the LOCOS oxidation depth of the silicon (the eroded amount of the silicon) after the performance of the LOCOS oxidation, illustrated in FIG. 28C, is represented by z, and the wet oxidation depth of the silicon (the eroded amount of the silicon) after the performance of the gate oxidation illustrated in FIG. 28D and the subsequent performance of the polysilicon gate wet oxidation illustrated in FIG. 28E is represented by a, the following relationships are satisfied among these values of x, y, z and a. At this time, regarding the gate oxidation of FIG. 28D, since the whole is oxidized, the configuration exhibits no variation.

$$a \leq y+z \quad (1)$$

$$z \leq x+y \quad (2)$$

More specifically, in this embodiment, it is arranged that x=425 Å and y=1000 Å. Namely, the thickness of the LOCOS oxide film 32 is 9500 Å and the LOCOS oxidation depth z of the silicon (the eroded amount of the silicon) is approximately 4750 Å, with the result that from the expression (1) the value of a becomes not more than 5750 Å. Actually, the oxidation depth a of the silicon which is obtained through the performance of the wet oxidation in FIG. 28E is approximately 1000 Å and this value satisfies the expression (1). Also, in a case where the expression (2) is satisfied, the angular portion can be effectively rounded.

Incidentally, in a case where no second-time chemical dry etching is performed (y=0), the following relationship is satisfied among the values of a, x, y and z.

$$a \leq z \quad (3)$$

Further, when the following expression (4) is satisfied, the resulting effect is better (the angular portion becomes more round).

$$(a \leq) x = z \quad (4)$$

Figure 12:
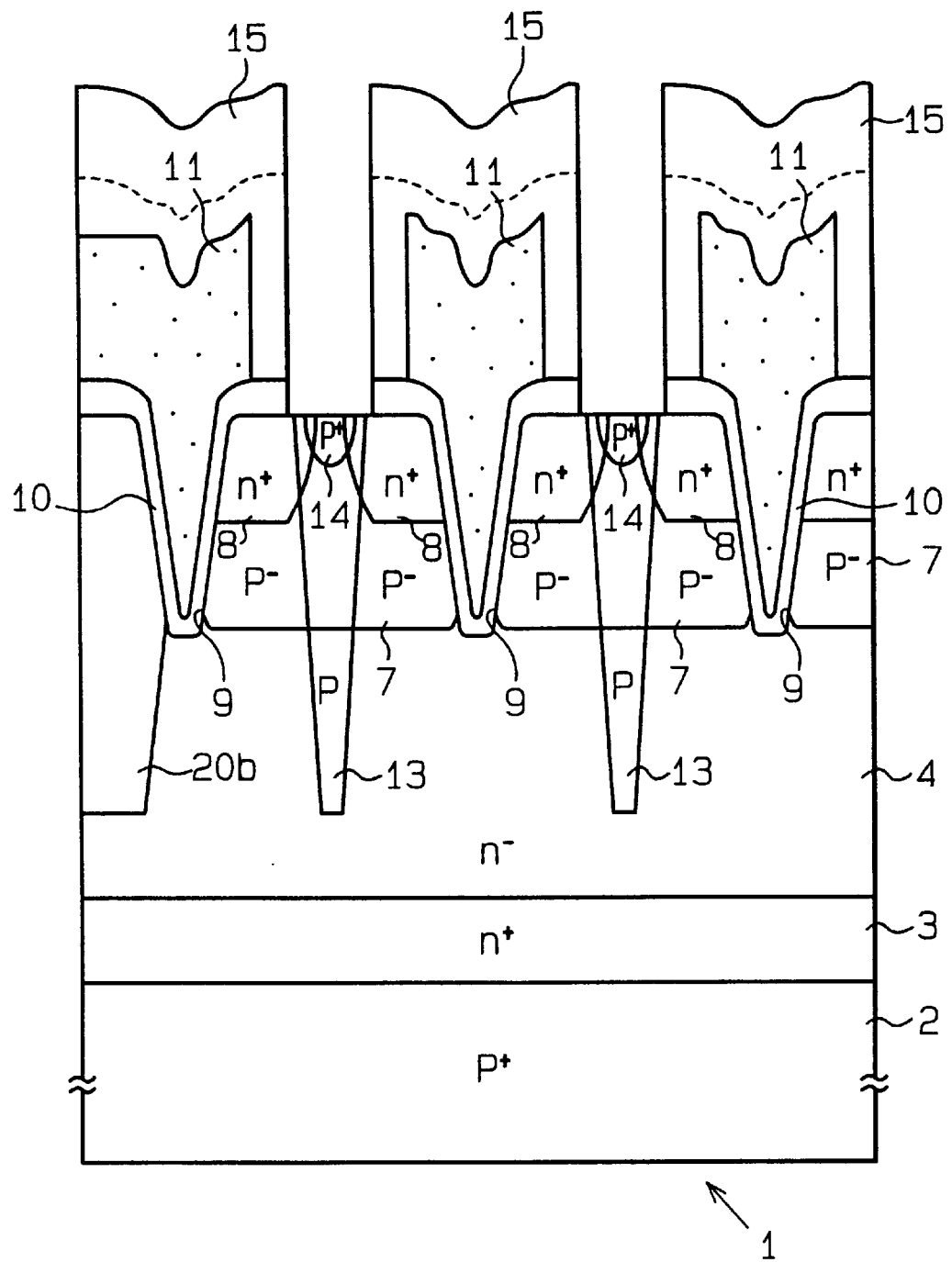

Turning back to the explanation of the manufacturing steps, subsequently, after the interlayer insulation film (BPSG film) 15 is formed as illustrated in FIG.12, the emitter electrode 17 of aluminum or the like and the collector electrode 18 on the reverse surface are formed as illustrated in FIG. 2.

In this way, the concave type IGBT can be obtained.

When, in this way, chemical dry etching is performed using the silicon nitride film 28 shown in FIG. 18 as a mask, wet oxidation of FIG. 19 is performed, wet etching of the oxide film in FIG. 20 is performed using the silicon nitride film 28 as a mask and second-time chemical dry etching of FIG. 21 is performed using the silicon nitride film 28 as a mask, after which cell LOCOS oxidation and removal of the resulting oxide film 32 are performed, it is possible to make round the angular portion located surrounding the groove at the time when the final gate oxide film 10 illustrated in FIG. 24 is formed. Accordingly, it is possible to suppress the decrease in the service life of the gate due to the concentration of the electric field on this angular portion.

That is, when manufacturing the concave type IGBT, by using the wet oxidation step of FIG. 19 and the wet etching step of the resulting oxide film and using the chemical dry etching step of FIG. 21 and the LOCOS oxidation step of FIG. 22, it is possible to make round the angular portion of the groove resulting from the chemical dry etching of FIG. 18 and thereby increase the service life of the gate, thus ensuring a high level of reliability. Also, by adding the wet oxidation step of FIG. 19, the withstanding voltage of the gate oxide film can be enhanced compared to a case where the groove 30 is formed only through the exposure step for exposing the silicon around the groove in FIG. 20 and the chemical dry etching step of FIG. 21.

As mentioned above, this embodiment has the following features.

(a) The silicon nitride film 28 which serves as the mask having the opening portion at its predetermined region is formed on the obverse surface of the semiconductor substrate 1 (first step), the groove 30 is formed in the semiconductor substrate 1 through the opening portion 31 of the silicon nitride film 28 (second step), the surface of the semiconductor substrate 1 which is located on the outer-peripheral side of the groove from the angular portion defined between the side surface 30a of this groove 30 and the surface of the semiconductor substrate 1 is exposed (third step), and the inner surface of the groove 30 and the exposed surface of the semiconductor substrate 1 are oxidized to thereby form the LOCOS oxide film 32 (fourth step). In this step, the angular portion defined between the side surface 30a of the groove 30 and the surface of the semiconductor substrate 1 is rounded. Then, the LOCOS oxide film 32 is removed (fifth step).

By using the groove 9 formed as mentioned above, it is possible to obtain the concave type IGBT wherein the polysilicon electrode 11 has been extended, through the gate oxide film 10, in such a way as to oppose the angular portion defined between the side surface 9a of the groove 9 and the surface of the semiconductor substrate 1. At this time, the angular portion defined between the side surface 9a of the groove 9 and the surface of the semiconductor substrate 1 is rounded, with the result that in the concave type IGBT it is possible to suppress the decrease in the service life of the gate due to the concentration of the electric field on the angular portion of the groove.

Also, when forming the LOCOS oxide film 32 by oxidizing the inner surface of the groove 30 and the exposed surface of the semiconductor substrate 1, an angle θ2 of taper (<θ1) illustrated in FIG. 21 becomes smaller than the angle θ1 of taper defined by the side surface 30a of the groove 30, illustrated in FIG. 18. As a result of this, even when in this and thereafter succeeding oxidation steps (specifically, the LOCOS oxidation illustrated in FIG. 21, the gate oxidation illustrated in FIG. 24 and the wet oxidation illustrated in FIG. 27) the upper surface of the silicon is lowered, at the time of forming the element, the portion of the side surface of the groove at which the angle θ2 of taper is being smaller becomes an upper end of the side surface of the groove 30 (9). Here, when referring to the angles θ1 and θ2 of taper of the side surface 30a of the groove 30, the angles θ1 and θ2 of taper represent the angles each of which when describing a circle having a unit length of radius with the angular portion between the side surface of the groove and the surface of the substrate being used as the center is defined between the intersection of this circle and the surface of the substrate and the intersection of this circle and the side surface of the groove 30a.

(b) In the second step under the description (a), the groove 30 is formed by performing chemical dry etching with the resist 29 being left to exist on the silicon nitride film 28 as it is. Accordingly, when this etching is performed, the silicon nitride film 28 is protected by the resist 29 and so it is possible to suppress the thinning of this silicon nitride film 28 due to the performance of this etching compared to a case where there is not the resist 29. Although in a case where the resist 29 has been removed it is necessary that the silicon nitride film 28 be formed thick, it is possible in this embodiment to thin the silicon nitride film 28 to a thickness of approximately 1500 Å.

(c) In the third step under the description (a), with the silicon nitride film 28 which is used as the mask in the second step being left existent, the silicon oxide film 27 located thereunder is removed by self-alignment, thereby causing the surface of the semiconductor substrate 1 to be exposed. Accordingly, being compared to a case where the silicon nitride film 28 and silicon oxide film 27 are removed and thereafter a mask material is newly disposed, the mask can be disposed around the groove 30 with a high configuration precision, with the result that it is possible to cause the surface of the semiconductor substrate to be exposed with a high precision, with the result that the withstanding voltage is enhanced.

(d) In the third step under the description (c), by removing the silicon oxide film 27 located under the silicon nitride film 28 used as the mask by isotropic etching, the surface of the semiconductor substrate 1 can be easily exposed.

(e) Since the isotropic etching under the description (d) is realized by the performance of wet etching, this etching can be easily performed.

(f) In the second step under the description (a), after forming the groove 30, the process for forming the oxide film 33 on the inner surface of the groove 30 by wet oxidation is performed. Therefore, the portions of the inner surface of the groove which have been damaged by dry etching are eliminated and the angular portion of the groove can be made further round.

(Second Embodiment)

Next, a second embodiment of the present invention will be explained with reference to FIGS. 29 to 33 with a focus placed on the differences from the first embodiment. It is to be noted that in FIGS. 29 through 33, the illustration of the $p^+$ type silicon substrate 2, $n^+$ type epitaxial layer 3, etc. is omitted.

Figure 29:
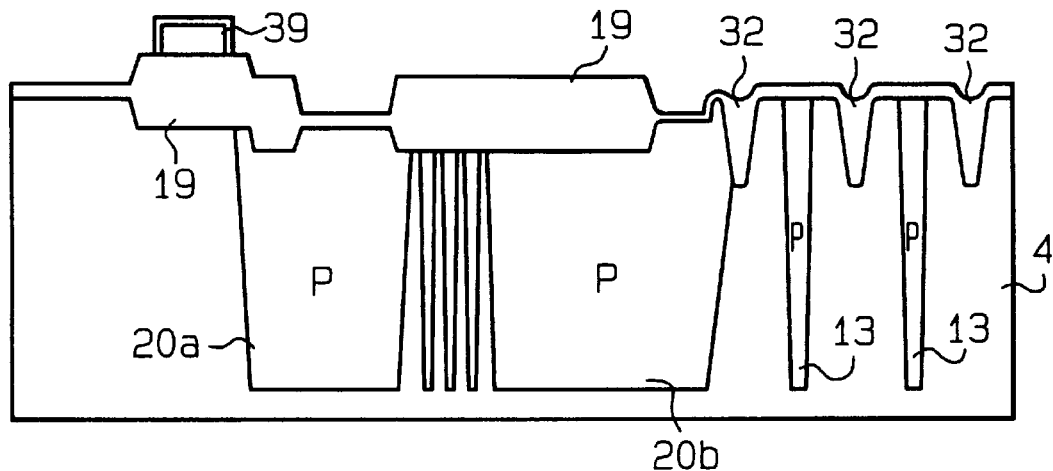
FIGS. 29 to 33 are sectional views illustrating manufacturing steps each for manufacturing a semiconductor device according to a second embodiment of the present invention.

As illustrated in FIG. 29, after cell LOCOS oxidation is performed with respect to the groove formation portions, a polysilicon film 39 is deposited over the entire surface of the wafer to form a polysilicon Zener diode on the LOCOS oxide film 19. Then, using a resist as the mask, dry etching is performed, whereby only the polysilicon film used to form the Zener diode alone is left.

Figure 30:
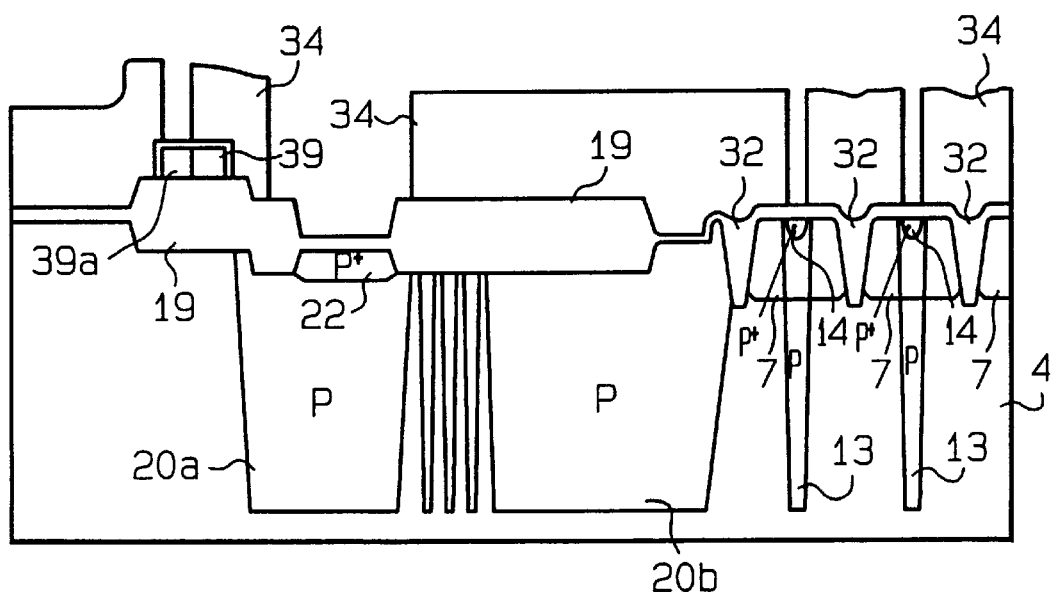

Next, as illustrated in FIG. 30, after forming the channel regions 7, using a resist 34 as a mask, boron ions are implanted simultaneously with respect to a region 39a of the Zener diode which becomes a future p type region and $p^+$ regions 14 with which contact to the electrode is made, after which thermal diffusion is further performed.

Figure 31:
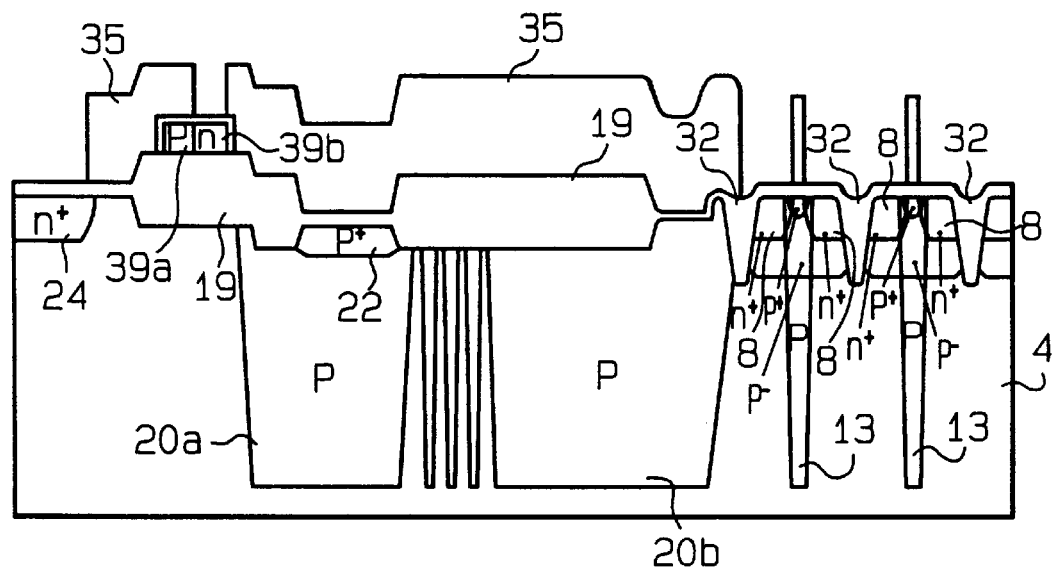
Figure 32:
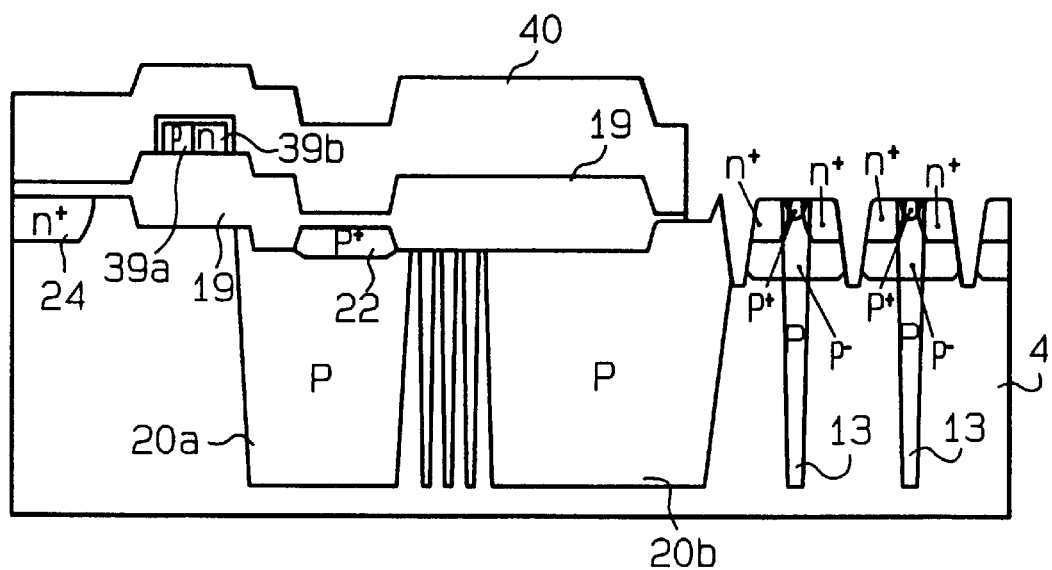

Next, as illustrated in FIG. 31, using a resist 35 as a mask, arsenic (As) or phosphorus (P) ions are implanted with respect to a region 39b of the Zener diode which becomes a future n type region and $n^+$ type source regions 8, after which thermal diffusion is further performed. Then, as illustrated in FIG. 32, with the outer-peripheral portion of the wafer being covered with a resist 40, the oxide film of the unit cell portion is removed to thereby cause the silicon to be exposed.

Figure 33:
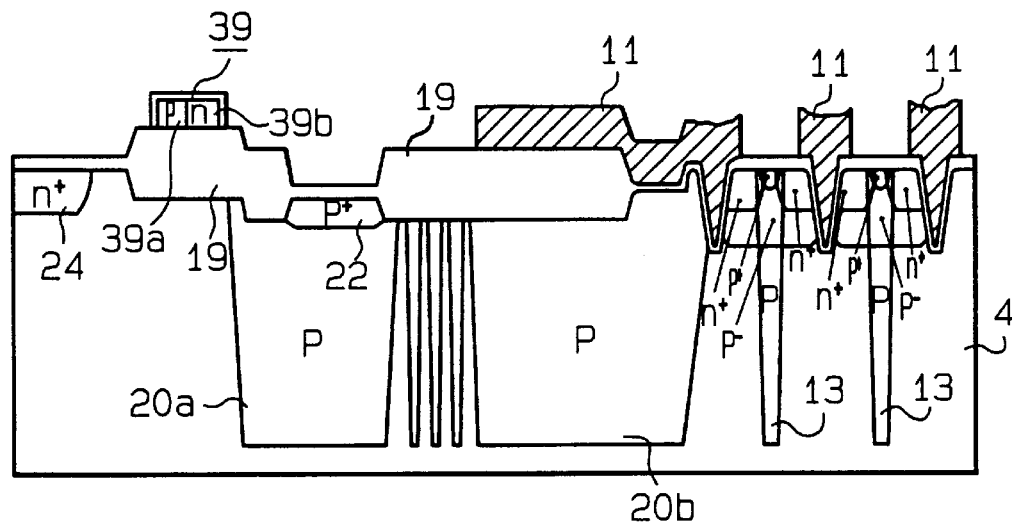

Further, as illustrated in FIG. 33, the polysilicon gate electrodes 11 are disposed. In this way, the semiconductor layer of the unit cell portion 5 is formed and simultaneously a desired polysilicon Zener diode can be formed.

It is to be noted that the p type region may be first formed with respect to each of the regions 39a and 39b and then the n type region may be formed with respect to the region 39b by way of compensation made by ion implantation of an n type impurity. Also, although in the above-described manufacturing steps the n type region 39b has been formed after having formed the p type region 39a, the p type region 39a may be formed after having formed the n type region 39b. In this case, the order of forming the regions is reversed in such a way as to first form the $n^+$ type source region 8 and then form the $p^+$ contact region 14. In this case, the n type region may be first formed with respect to each of the regions 39a and 39b and then the p type region may be formed with respect to the region 39a by way of compensation made by ion implantation of a p type impurity.

The above-mentioned polysilicon Zener diode (39a, 39b) can be used as a temperature sensor.

As its other modes, the invention may be worked out as follows.

As illustrated in FIG. 18, when forming the groove 30 in the semiconductor substrate 1, in the above-described embodiments this groove has been formed by chemical dry etching. However, the invention is not limited thereto and permits the groove to be formed using, for example, reactive ion etching (RIE) or wet etching, or forming an oxide film by the LOCOS oxidation technique and then removing this oxide film.

Also, as illustrated in FIG. 20, as the etching for exposing the surface of the semiconductor substrate 1 located on the outer-peripheral side of the groove 30 from the angular portion between the side surface 30a of this groove 30 and the surface of the semiconductor substrate 1, the second-time chemical dry etching technique has been used in the abovedescribed embodiments. However, the invention is not limited thereto and permits the use of reactive ion etching (RIE) or wet etching.

Figure 34:
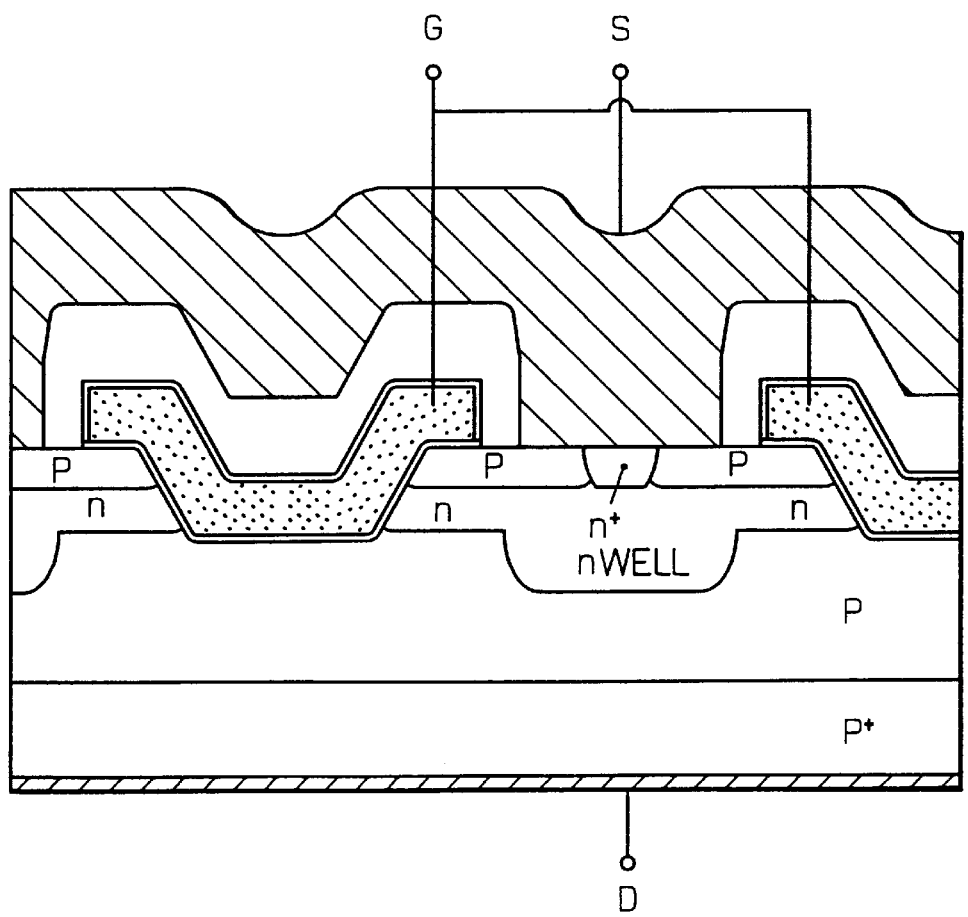
FIG. 34 is a sectional view illustrating the construction of a semiconductor device according to a modification of the present invention.

Furthermore, in the above-described embodiments, the invention has been embodied as a concave type IGBT. However, the invention may be embodied as a concave type DMOSFET such as that illustrated in FIG. 34.

What is claimed is:

1. A method for manufacturing a semiconductor device in which a groove is formed in a surface of a semiconductor substrate;

a source region is formed at an upper part of a region located along a side surface of the groove;

a channel region is formed under the source region; and a gate electrode is extended, through a gate insulation film, in such a way as to oppose an angular portion defined between the side surface of the groove and the surface of the semiconductor substrate, comprising:

a first step for forming a mask having an opening portion at its predetermined region on the surface of the semiconductor substrate;

a second step for forming the groove in the semiconductor substrate through the opening portion of the mask;

a third step for exposing the surface of the semiconductor substrate located on an outer-peripheral side of the groove from the angular portion defined between the side surface of the groove and the surface of the semiconductor substrate to chamfer the angular portion;

a fourth step for oxidizing an inner surface of the groove and the exposed surface of the semiconductor substrate to thereby form an oxide film; and a fifth step for removing the oxide film.

2. A method for manufacturing a semiconductor device as set forth in claim 1, wherein in the second step the groove is formed in the semiconductor substrate by dry etching.

3. A method for manufacturing a semiconductor device as set forth in claim 2, wherein the dry etching is chemical dry etching.

4. A method for manufacturing a semiconductor device as set forth in claim 3, wherein the mask formed in the first step includes a resist film and in the second step chemical dry etching is performed using this resist film as a mask.

5. A method for manufacturing a semiconductor device as set forth in claim 2, wherein the second step includes a process for, after the formation of the groove, forming an oxide film on the inner surface of the groove by wet oxidation.

6. A method for manufacturing a semiconductor device as set forth in claim 5, wherein in the second step the groove is formed in the semiconductor substrate by chemical dry etching.

7. A method for manufacturing a semiconductor device as set forth in claim 6, wherein the mask formed in the first step includes a resist film and in the second step chemical dry etching is performed using this resist film as a mask.

8. A method for manufacturing a semiconductor device as set forth in claim 1, wherein the mask used in the second step includes a nitride film and an oxide film located under the nitride film and the oxide film is removed in the third step by self-alignment and by using the mask including the nitride film.

9. A method for manufacturing a semiconductor device as set forth in claim 8, wherein in the third step the oxide film is removed by isotropic etching.

10. A method for manufacturing a semiconductor device as set forth in claim 9, wherein the isotropic etching is wet etching.

11. A method for manufacturing a semiconductor device as set forth in claim 8, wherein in the fourth step the oxide film is formed by self-alignment and by using the mask including the nitride film.

12. A method for manufacturing a semiconductor device as set forth in claim 11, wherein in the third step the oxide film is removed by isotropic etching.

13. A method for manufacturing a semiconductor device as set forth in claim 12, wherein the isotropic etching is wet etching.

14. A method for manufacturing a semiconductor device as set forth in claim 1, wherein the third step consists of a first exposing step for removing an oxide film provided on the surface of the semiconductor substrate located on the outer-peripheral side of the groove and a second exposing step for removing a portion including the angular portion defined between the groove and the surface of the semiconductor substrate by chemical dry etching.

15. A method for manufacturing a semiconductor device as set forth in claim 14, wherein the mask used in the second step includes a nitride film and the oxide film located under nitride film and oxide film is removed in the third step by self-alignment by using the mask including the nitride film.

16. A method for manufacturing a semiconductor device as set forth in claim 15, wherein in the fourth step the oxide film is formed by self-alignment by using the mask including the nitride film.

17. A method for manufacturing a semiconductor device as set forth in claim 16, wherein in the first exposing step of the third step the oxide film is removed by isotropic etching.

18. A method for manufacturing a semiconductor device as set forth in claim 17, wherein the isotropic etching is wet etching.

19. A method for manufacturing a semiconductor device in which a groove is formed in a surface of a semiconductor substrate; a source region is formed at an upper part of a region located along a side surface of the groove; a channel region is formed under the source region; and a gate electrode is disposed, through a gate insulation film, with respect to at least the side surface of the groove, comprising:

a first step for forming the groove in the surface of the semiconductor substrate;

a second step for selectively forming an oxide film at a predetermined region on the semiconductor substrate including the groove;

a third step for forming a polycrystalline silicon film of a predetermined configuration on the oxide film formed by the second step;

a fourth step for introducing a first conductivity type impurity into an element forming region located at the side of the groove so as to form the channel region;

a fifth step for introducing into the element forming region a first conductivity type impurity having a concentration higher than the impurity introduced for forming the channel region, so as to form a contact region in the channel region and for introducing this first conductivity type impurity also into a part of the polycrystalline silicon film;

a sixth step for introducing a second conductivity type impurity into the element forming region so as to form the source region and for introducing this second conductivity type impurity also into a region adjacent to the region of the polycrystalline silicon film into which the first conductivity type impurity has been introduced; and a seventh step for removing the oxide film located at the side of the element forming region, whereby a diode is formed in the polycrystalline film through the execution of the fifth and sixth steps.

20. A method for manufacturing a semiconductor device as set forth in claim 19, wherein an IGBT is formed in the semiconductor device.

21. A method for manufacturing a semiconductor device as set forth in claim 19, wherein the diode formed in the polycrystalline silicon film is used as a temperature sensor.

22. A method for manufacturing a semiconductor device, comprising:

forming a mask having an opening portion on a surface of a semiconductor substrate forming a groove in the semiconductor substrate through the opening portion of the mask;

etching a surface portion of the semiconductor substrate surrounding the groove and underlying the mask to chamfer an angular portion defined between an inner surface of the groove and the surface of the semiconductor substrate;

oxidizing the inner surface of the groove to form an oxide film through the mask; and removing the oxide film.

23. A method for manufacturing a semiconductor device of claim 22, wherein the groove is formed in the semiconductor substrate by chemical dry etching.

24. A method for manufacturing a semiconductor device of claim 22, wherein the mask is disposed on the semiconductor substrate with a pad oxide film interposed therebetween.

25. A method for manufacturing a semiconductor device of claim 22, wherein etching the surface portion of the semiconductor substrate is carried out by chemical dry etching.

* * * * *